United States Patent
Grodzki et al.

(10) Patent No.: US 11,747,420 B2
(45) Date of Patent: Sep. 5, 2023

(54) ACTUATION OF A MAGNETIC RESONANCE DEVICE WITH SPECIFIC SATURATION

(71) Applicant: Siemens Healthcare GmbH, Erlangen (DE)

(72) Inventors: David Grodzki, Erlangen (DE); Dieter Ritter, Fürth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/691,961

(22) Filed: Mar. 10, 2022

(65) Prior Publication Data

US 2022/0291316 A1    Sep. 15, 2022

(30) Foreign Application Priority Data

Mar. 11, 2021   (DE) .................. 10 2021 202 362.2

(51) Int. Cl.
*G01V 3/00* (2006.01)
*G01R 33/48* (2006.01)
*G01R 33/483* (2006.01)

(52) U.S. Cl.
CPC ..... *G01R 33/4828* (2013.01); *G01R 33/4838* (2013.01)

(58) Field of Classification Search
CPC ........................................................ A61G 1/02
USPC ........................................................ 324/318
See application file for complete search history.

(56) References Cited

U.S. PATENT DOCUMENTS

| | | | |
|---|---|---|---|
| 2004/0100258 A1 | 5/2004 | Gurr | |
| 2005/0189940 A1 | 9/2005 | Feiweier | G01R 33/5612 324/309 |
| 2008/0081986 A1 | 4/2008 | Slavin | A61B 5/055 600/410 |
| 2009/0270719 A1 | 10/2009 | Miyoshi | G01R 33/5635 600/419 |
| 2013/0009640 A1 | 1/2013 | Fautz | G01R 33/5605 324/309 |

(Continued)

FOREIGN PATENT DOCUMENTS

DE    102020202830 A1    9/2021

OTHER PUBLICATIONS

Lin, Chen et al: "Fat suppression techniques in breast magnetic resonance imaging: a critical comparison and state of the art"; Reports in Medical Imaging; Year: 2015.

(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

The present disclosure is directed to techniques for actuation of a magnetic resonance device for generating a high frequency pulse for specific saturation of nuclear spins in an examination region of an examination object. The techniques may include providing a frequency spectrum of the examination region, providing a B0 field map, establishing a first resonance frequency for a first tissue and a second resonance frequency for a second tissue taking account of the frequency spectrum, determining a saturation pulse by establishing a high frequency pulse configured for a spectrally selective excitation of the first tissue and the second tissue taking account of the first resonance frequency, the second resonance frequency and the B0 field map, and outputting the saturation pulse by means of the high frequency antenna unit.

18 Claims, 2 Drawing Sheets

(56) References Cited

U.S. PATENT DOCUMENTS

Figure 1:
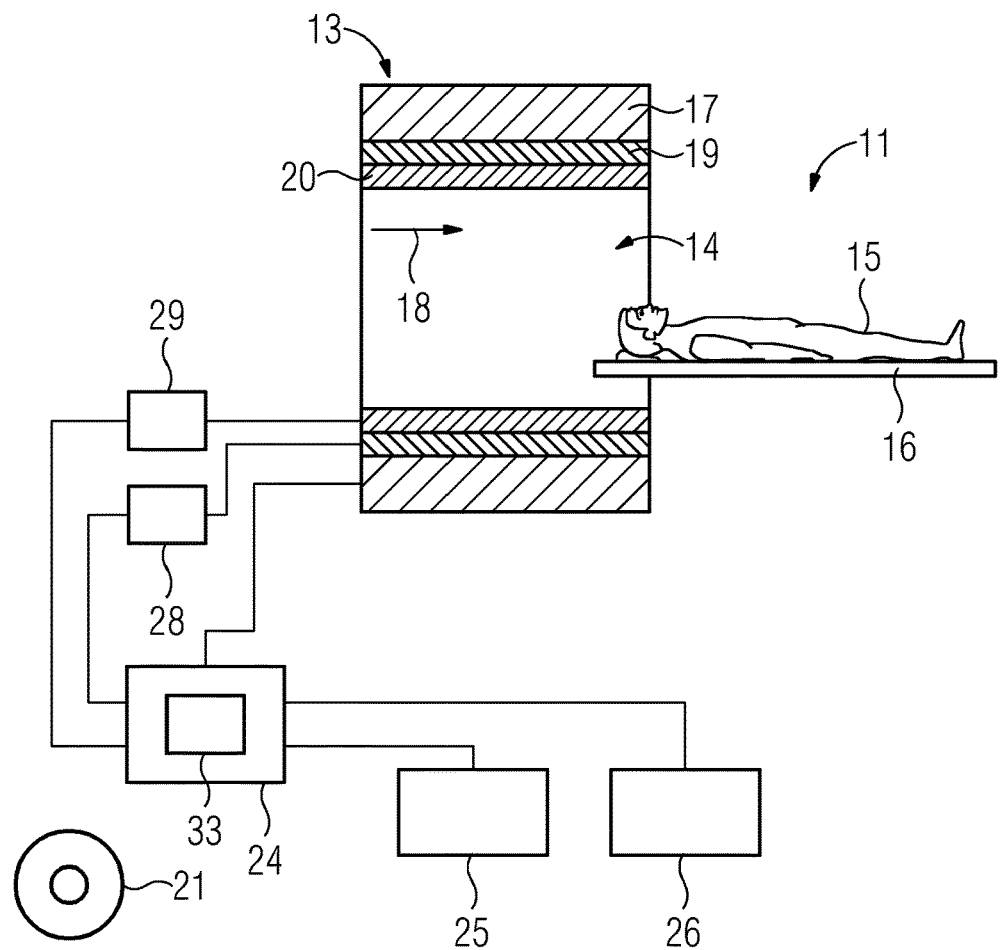

2021/0278492 A1   9/2021   Grodzki et al.

OTHER PUBLICATIONS

Gumbrecht, Rene: "Dissertation Friedrich-Alexander-Universitat Erlangen Nürnberg: Development of customized pTx MR excitation methods and their safe application"; Veröffentlichungsdatum: Oct. 25, 2013; [recherchiert am Nov. 19, 2021].

Ren J. et al.: "Composition of adipose tissue and marrow fat in humans by H NMR at 7 Tesla-" J. Lipid Res., Sep. 2008: 49(9): 2055-2062 https://www.ncbi.nlm.nih.gov/pmc/articles/PMC2515528/.

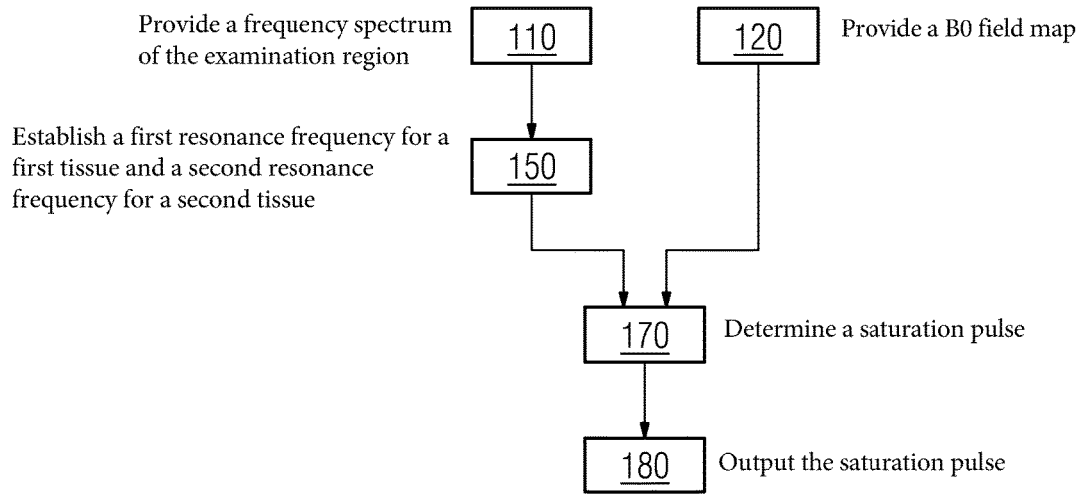
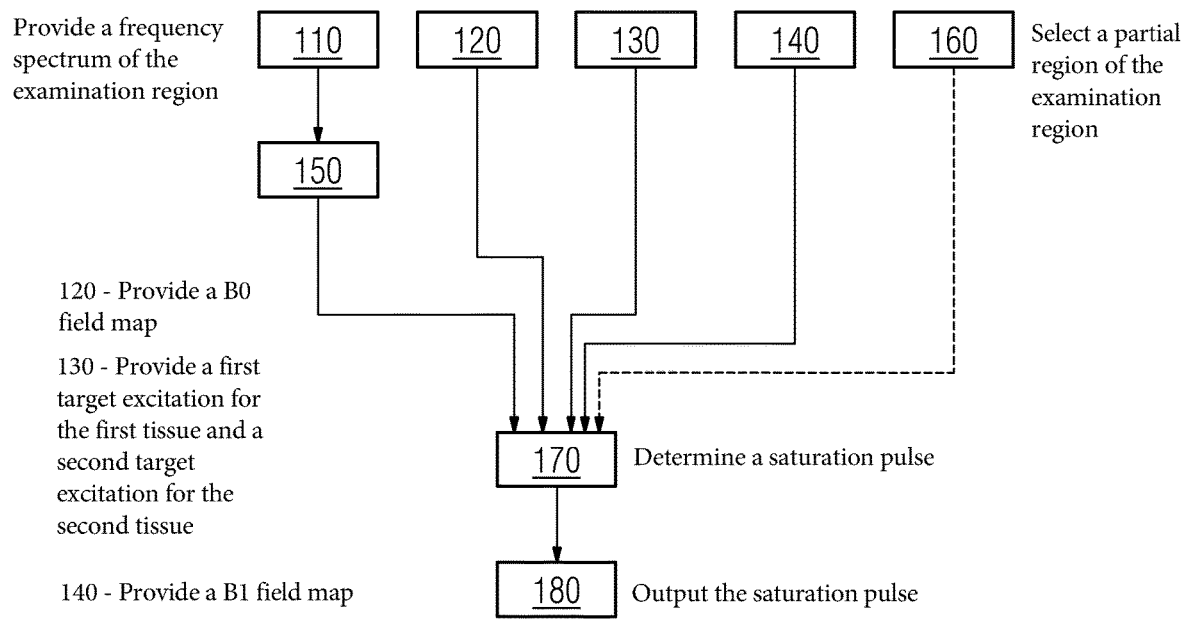

ACTUATION OF A MAGNETIC RESONANCE DEVICE WITH SPECIFIC SATURATION

CROSS-REFERENCE TO RELATED APPLICATIONS

The present application claims the benefit of the filing date of Germany patent application no. DE 10 2021 202 362.2, filed on Mar. 11, 2021, the contents of which are incorporated herein by reference in their entirety.

TECHNICAL FIELD

The disclosure relates to a magnetic resonance device, a computer program product, and an electronically readable data carrier for actuation of a magnetic resonance device through output of a saturation pulse.

BACKGROUND

In a magnetic resonance device, the body to be examined of an examination object, particularly that of a patient, is typically exposed to a relatively strong main magnetic field of, for example, 1.5 or 3 or 7 tesla, with the aid of a main magnet. In addition, gradient pulses are applied with the aid of a gradient coil unit. By means of a high frequency antenna unit, using suitable antenna facilities, high frequency pulses, for example excitation pulses, are then emitted, which has the effect that the nuclear spins of particular atoms excited into resonance by these high frequency pulses are tilted by a defined flip angle relative to the magnetic field lines of the main magnetic field. On relaxation of the nuclear spin, high frequency signals, so-called magnetic resonance signals, are emitted and are received by means of suitable high frequency antennae and then further processed. From the raw data thereby acquired, the desired image data can finally be reconstructed.

For a particular scan, therefore, a particular magnetic resonance control sequence (MR control sequence), also known as a pulse sequence, which consists of a sequence of high frequency pulses, for example excitation pulses and refocusing pulses, as well as gradient pulses to be emitted suitably coordinated therewith on various gradient axes along different spatial directions, is to be emitted. Temporally adapted thereto, readout windows are set which specify the timespans within which the induced magnetic resonance signals are acquired. The high frequency pulses typically correspond to an alternating magnetic field.

The intensity of MR signals is dependent on the environment of the nuclear spins, in particular the molecules which comprise the nuclear spins. By this means, a contrast arises in the reconstructed image data, wherein fat, for example, has a different signal intensity from water, which predominates, for example, in muscle tissue. The suppression of signals emerging from a particular tissue, also known as saturation, is a common technique in magnetic resonance imaging. The saturation can take place spectrally, wherein the chemical displacement between nuclear spins in different tissues is utilized: nuclear spins have a different resonance frequency, or Larmor frequency in relation to the strength of the main magnetic field, dependent on the surrounding tissue. Initially, a saturation pulse, that is a high frequency pulse with a small frequency bandwidth for resonant excitation of the nuclear spins in a defined tissue is transmitted, which dephases nuclear spins in the defined tissue before high frequency pulses and gradient pulses for generating the MR signals are transmitted. The saturation pulses have a frequency band such that nuclear spins are largely not excited in another tissue. Only nuclear spins that lie outside the frequency band of the saturation pulses then contribute to the MR signals for the imaging. The spectral saturation is dependent, in particular, on the homogeneity of the main magnetic field and the tissue to be suppressed, that is, to be saturated.

SUMMARY

It is an object of the disclosure to provide a method for an actuation of a magnetic resonance device with particularly individual saturation of tissue. The object is achieved with the features of the embodiments as described herein, including the claims.

The method according to the disclosure for an actuation of a magnetic resonance device comprising a high frequency (e.g. radio frequency (RF)) antenna unit configured for generating a high frequency (e.g. RF) pulse for specific saturation of the nuclear spins in an examination region of an examination object provides the following method steps:
  providing a frequency spectrum of the examination region,
  providing a B0 field map,
  establishing a first resonance frequency for a first tissue and a second resonance frequency for a second tissue taking account of the frequency spectrum,
  determining a saturation pulse by establishing a high frequency pulse configured for a spectrally selective excitation of the first tissue and the second tissue taking account of the first resonance frequency, the second resonance frequency and the B0 field map,
  outputting the saturation pulse by means of the high frequency antenna unit.

From a region of the examination object, the examination region, typically in the context of the magnetic resonance examination, image data is to be generated. The examination object is typically a patient. The examination region typically comprises a portion of the examination object.

The frequency spectrum typically indicates the signal intensity in the examination region dependent on the frequency. Since the Larmor frequency of nuclear spins depends on the tissue surrounding the nuclear spins, there is a spectral distribution of the signal intensity. The Larmor frequency results from the gyromagnetic relationship of the nuclear spin and the strength of the magnetic field surrounding the nuclear spin. The magnetic field surrounding the nuclear spin results predominantly from the main magnetic field which, however, is modulated due to the chemical environment of the nuclear spin, in particular due to the tissue surrounding the nuclear spin. The modulation is quantified on the basis of the chemical shift, which in the case of fat and water, for example, is approximately 3.4 ppm. In addition, the main magnetic field can itself have local variations. The main magnetic field can also be referred to as the B0 field. The B0 field map reproduces the strength of the main magnetic field spatially resolved. The B0 field map is typically restricted to the examination region. The frequency spectrum typically has a plurality of peaks wherein each peak is characteristic of a specific tissue. The spectral position of the peaks enables an extraction of the first resonance frequency and/or the second resonance frequency.

The providing of the B0 field map can comprise a recording of the B0 field map. The B0 field map can be stored on a storage medium which is accessed in the context of the providing. The providing of the frequency spectrum can comprise a recording of the frequency spectrum. The frequency spectrum can be stored on a storage medium which is accessed in the context of the providing.

High frequency pulses (e.g. RF pulses) have a frequency bandwidth about a base frequency and are accordingly emitted in a frequency band defined by the base frequency and the frequency bandwidth. The base frequency corresponds to the frequency of the high frequency pulse, which is the carrier frequency. A high frequency pulse causes a resonant excitation of a substance provided the Larmor frequency corresponds to a nuclear spin occurring within the substance, which is the resonance frequency of the substance, the frequency of the high frequency pulse, in particular at the position of the nuclear spin. A high frequency pulse can bring about an excitation of a substance provided the Larmor frequency of a nuclear spin occurring within the substance is covered by the frequency band of the high frequency pulse. The resonance frequency of a substance typically corresponds to the Larmor frequency of a nuclear spin occurring within the substance.

A substance can be, for example, a molecule, a composition of different molecules, and/or a tissue. A substance can also be a further structure, which is not explicitly named herein and is not restricted to the examples named. The first tissue and the second tissue are typically different from one another. The resonance frequency of a tissue typically corresponds to the Larmor frequency of a nuclear spin occurring within the tissue.

A high frequency pulse configured for a spectrally selective excitation of the first tissue and the second tissue typically has a frequency band which comprises the first resonance frequency and the second resonance frequency.

The establishment of the high frequency pulse configured for spectrally selective excitation of the first tissue and the second tissue, taking account of the B0 field map, typically takes place such that a local influence starting from local changes in the main magnetic field on the first resonance frequency and/or on the second resonance frequency, e.g. a local modulation of the first resonance frequency and/or the second resonance frequency is determined and/or taken into account on the basis of the B0 field map. The established high frequency pulse configured for a spectrally selective excitation of the first tissue and the second tissue is designated a saturation pulse.

The establishment of the high frequency pulse can comprise an optimization. The optimization can take place with regard to a complete saturation, e.g. a defined target excitation of, for example, 90° for the first resonance frequency and the second resonance frequency and no modulation of nuclear spins with a defined further resonance frequency, within the examination region. The further resonance frequency can correspond, for example, to the Larmor frequency of water. This would bring about a complete suppression of the first tissue and the second tissue, but no influencing of the signal starting from the nuclear spins in water during the MR imaging.

The output of the saturation pulse via the high frequency antenna unit typically comprises an actuation of the high frequency antenna unit according to an electric current and/or electric voltage defining the saturation pulse. The saturation pulse may be output in the context of an MR control sequence, temporally before an excitation pulse, wherein the subsequent high frequency pulses and gradient pulses comprise a generation of magnetic resonance signals and an acquisition of raw data which can be reconstructed to image data. The correspondingly reconstructed image data typically has a saturation, which is a signal reduction and/or signal suppression for the first tissue and the second tissue.

The method according to the disclosure enables an individual saturation of at least two tissues. Taking account of the B0 field map enables a correction of local variations of the main magnetic field, whereby the saturation of the two tissues takes place particularly precisely. By this means, an improved diagnosis based on the resulting image data can be achieved.

An embodiment of the method additionally comprises providing a first target excitation for the first tissue and a second target excitation for the second tissue and a providing of a B1 field map, wherein the determination of the saturation pulse takes place while taking account of the B1 field map such that the selective excitation of the first tissue and of the second tissue corresponds to the target excitation.

The high frequency unit, e.g. the high frequency (e.g. RF) antenna unit is configured for emitting a high frequency (e.g. RF) pulse. A high frequency pulse is configured to generate an alternating magnetic field B1 for exciting nuclear spins in the examination region. The B1 field map typically specifies variations in the amplitude of the high frequency alternating magnetic field B1 in a spatially resolved manner, which is generated on emission of a high frequency pulse. It can be caused by the geometry of the high frequency antenna unit or by the interaction with the examination object, for example, a damping or absorption in the body. A B1 field map can take place, for example, by excitation and read-out from a phantom in advance, or with the patient, for example, by phase-sensitive mapping or by Bloch-Siegert shift. The providing of the B1 field map can comprise a recording of the B1 field map. The B1 field map can be stored on a storage medium which is accessed in the context of the providing. The B1 field map is typically restricted to the examination region.

The target excitation is typically a defined flip angle that is to be achieved, about which flip angle the nuclear spins, e.g. of a particular tissue, are to be tilted by the emission of a high frequency pulse. The first target excitation typically corresponds to the flip angle to be generated in the first tissue by the saturation pulse. The second target excitation typically corresponds to the flip angle to be generated in the second tissue by the saturation pulse. The first target excitation can correspond to the second target excitation. The first target excitation and/or the second target excitation may correspond e.g. to 90° or 180°.

The determination of the saturation pulse may comprise an optimization of the high frequency pulse with regard to at least two of the following conditions:
  generating the first target excitation in the first tissue
  generating the second target excitation in the second tissue
  generating no target excitation in a further substance, such as for example, water, e.g. in a further tissue.

The optimization typically takes place taking account of the B0 field map and the B1 field map, e.g. within the examination region. This enables e.g., a determination and/or taking into account of a locally changed effect of the high frequency pulse on the nuclear spins due to a local inhomogeneity of the alternating magnetic field B1. For example, an amplitude of the alternating magnetic field B1 acknowledged in the B1 field map and locally reduced in one region can be compensated by a higher amplitude of the high frequency pulse in this region on use of a high frequency antenna unit having at least two transmitting channels or by a longer duration of the high frequency pulse. If the region of the B1 field variation correlates spatially with a different main magnetic field due to gradients or B0 field variations, then based on different Larmor frequencies, a variation of the amplitude for corresponding spectral portions of the high frequency pulse can also be used for spatial homogenization of the excitation by the high frequency pulse. In an advantageous manner by means of the saturation pulse, an inhomogeneity generated by a B1 variation in the image data can thus also be reduced. In this way, the first tissue and the second tissue can be saturated particularly efficiently.

An embodiment of the method provides that the determination of the saturation pulse is optimized with regard to the selective excitation of the first tissue in the examination region.

This embodiment may include the providing of a target excitation for the first tissue. The determination of the saturation pulse primarily comprises an achievement of the target excitation in the first tissue, e.g. in the whole examination region, preferably taking account of a B1 field map. This embodiment enables, apart from the saturation of the second tissue, which e.g. the first tissue is saturated in the whole of the examination region and thus is particularly well suppressed in the image data to be reconstructed.

An embodiment of the method additionally comprises a selection of a partial region of the examination region, wherein the determination of the saturation pulse is optimized with regard to the selective excitation of the second tissue in the partial region.

This embodiment may comprise providing of image data of the examination region of the examination object. The providing of the image data can comprise a display and/or recording of the image data by means of an MR control sequence. The image data can have been recorded, e.g., in the context of a scout scan, for example, for planning the MR examination and/or can be clinical image data suitable for a diagnosis. The partial region may be selected based on such image data.

The partial region may at least partially comprise the second tissue. The tissue comprised by the partial region typically comprises e.g. at least 30%, at least 50%, at least 70%, etc. of second tissue. Typically, e.g. at least 20%, at least 40%, at least 60%, etc. of the second tissue comprised by the examination region lies within the partial region.

This embodiment may comprise the providing of a target excitation for the second tissue.

The optimization of the saturation pulse with respect of the selective excitation of the second tissue in the partial region typically takes place such that in the partial region, the second tissue assumes the second target excitation, e.g. taking account of a B1 field map for the partial region. This enables a dedicated saturation of the second tissue in a defined partial region. The saturation of the first tissue is not restricted to the partial region. This enables a particularly efficient saturation since, e.g. the spatial distribution of the second tissue within the examination region can be taken into account in the optimization by way of the selection of the partial region and the variations of the main magnetic field and/or of the alternating magnetic field B1 present in the partial region. The partial region can also comprise the examination region, said partial region being particularly useful for a diagnosis and a saturation of the second tissue in this partial region being particularly relevant for a reliable diagnosis.

The determination of the saturation pulse may comprise an optimization of the high frequency pulse with regard to the following conditions:
generating the first target excitation in the first tissue in the examination region
generating the second target excitation in the second tissue in the partial region.

In addition, as a further condition for the saturation pulse, the generation of no target excitation in a further substance, such as for example, water, within the examination region or the partial region can be preset.

For instance, a second tissue which, due to the anatomical structure is present locally limited, for example subcutaneous fat, can be particularly efficiently saturated by way of a corresponding selection of the partial region and by taking account of the local variations of B0 and B1 present there. The optimized saturation pulse can, however, simultaneously saturate the first tissue, for example, within the whole examination region. According to this embodiment, the second tissue is consequently only locally saturated, e.g. in image regions in which the second tissue would particularly occur or it would particularly disturb the diagnosis.

The partial region can also lie peripherally to the part of the examination region that is relevant for the diagnosis. A saturation of the second tissue in the partial region can prevent artifacts such as for example convolution artifacts and/or ghosting artifacts, starting from the partial region relating to the portion of the examination region relevant for the diagnosis.

An embodiment of the method provides that the selection of the partial region takes place manually. This can take place by a user, for example, by calibrating or marking the partial region on the basis of image data. This can be implemented particularly intuitively and reliably.

An embodiment of the method provides that the selection of the partial region is landmark-based and/or model-based. This selection of the partial region may be performed on the basis of image data of the examination region of the examination object. The selection of the partial region can comprise providing a model, e.g. a trained model.

The examination region and/or a positioning of the examination object can be identified on the basis of landmarks. The model can comprise information regarding the examination region and/or regarding regions of the examination region within which the second tissue typically occurs. This embodiment enables a rapid, robust, and repeatable identification of the partial region and thus a robust saturation of the second tissue within the partial region.

An embodiment of the method provides that the establishment of the first resonance frequency and/or of the second resonance frequency is based on a relative relationship to a resonance frequency of water. The frequency spectrum typically has a significant peak for water which is typically robustly and automatically detected and corresponds to the resonance frequency of water. On the basis of spectral and/or chemical analyses of defined tissues, their chemical displacement relative to water is well known. Consequently, taking account of the chemical displacement of the first tissue and of the second tissue, their resonance frequency can be determined robustly and automatically.

An embodiment of the method provides that the first tissue comprises a first fat tissue and the second tissue comprises a second fat tissue.

The first fat tissue can comprise, for example, the fat type predominating in the human body having a chemical displacement of −3.5 ppm relative to water. The second fat tissue can comprise, for example, the fat type more seldom occurring in the human body having a chemical displacement of −0.1 ppm relative to water. For instance, the second fat tissue is typically not saturated during spectrally selective saturation, since the relevant frequency band can comprise the resonance frequency of water, which is typically undesirable. The restriction of the selective saturation of the second tissue to the partial region can reduce and/or eliminate this effect. The first fat tissue and/or the second fat tissue can also comprise brown fat and/or white fat. This embodiment thus enables a particularly comprehensive fat saturation, which is highly relevant for many clinical contrasts.

An embodiment of the method provides that the high frequency antenna unit comprises a plurality of transmitting elements and the saturation pulse has a plurality of components which are output when the saturation pulse is output by the plurality of transmitting elements. A saturation pulse of this type can compensate particularly well for local deviations of the alternating magnetic field and the main magnetic field and can simultaneously reduce the SAR load.

Furthermore, the disclosure relates to a magnetic resonance device with a high frequency antenna unit and a control unit comprising a determining unit.

The determining unit is configured to carry out a method for determining a saturation pulse.

The control unit is configured to carry out a method according to the disclosure for actuation of a magnetic resonance device by determination and output of the saturation pulse.

For this purpose, the determining unit typically has an input, a processor unit and an output. By means of the input, a frequency spectrum and/or a B0 field map and/or a B1 field map and/or information regarding the first tissue and the second tissue and/or a first target excitation and/or a second target excitation and/or an MR control sequence and/or image data can be provided to the determining unit. Further functions, algorithms or parameters required in the method can be provided to the determining unit via the input. The saturation pulse and/or the MR control sequence comprising the saturation pulse and/or further results of an embodiment of the method according to the disclosure can be provided via the output. The control unit typically has an input and an output. The control unit is typically configured to actuate the magnetic resonance device according to the MR control sequence comprising the saturation pulse. The control unit may be configured to actuate the magnetic resonance device according to a spectroscopic control sequence, which is configured to generate a frequency spectrum.

The control unit may be configured to actuate the magnetic resonance device according to a B0 control sequence which is configured to generate a B0 field map.

The control unit may be configured to actuate the magnetic resonance device according to a B1 control sequence which is configured to generate a B1 field map.

The determining unit and/or the control unit can be integrated into the magnetic resonance device. The determining unit and/or the control unit can also be installed separately from the magnetic resonance device. The determining unit and/or the control unit can be connected to the magnetic resonance device.

An embodiment of the magnetic resonance device additionally comprises a high frequency antenna control unit comprising a plurality of transmitting channels, wherein the high frequency antenna unit comprises a plurality of transmitting elements and each transmitting element is connected to a transmitting channel.

The high frequency antenna control unit may comprise at least two transmitting channels. The high frequency antenna unit may comprise at least two transmitting elements. Outputs of the high frequency antenna control unit are regarded as transmitting channels to which a high frequency pulse can be provided to feed a transmitting element, wherein the signals of the transmitting channels differ in amplitude, spectral power distribution and/or phase. A vector is also regarded herein as a high frequency pulse within the meaning of the disclosure, said vector comprising a plurality of excitation signals for individual transmitting channels which, on temporally coordinated emission via the high frequency antenna unit, that is via the individual transmitting elements, cause the excitation of the nuclear spins that is to be achieved in the examination volume. The high frequency antenna unit may be e.g. an antenna array with a plurality of transmitting elements, wherein the transmitting channels are each in signal connection to at least one transmitting element in order to generate a high frequency pulse in the form of an alternating magnetic field. These transmitting elements can be, for example, individual, or a plurality of, elements of a birdcage antenna, or a plurality of, antenna coils of a local coil array.

In the step of emitting the high frequency pulse, that is, the output of the saturation pulse, a predetermined spatial distribution of the excitation as an additional degree of freedom can thus also be achieved by interference of the signals of the plurality of transmitting channels via a plurality of transmitting elements of the high frequency antenna unit, which is adjusted during the step of determining the saturation pulse by variation of the phase and amplitude. In an advantageous manner, the homogeneity of the excitation can thereby be improved with a still lower SAR load.

Embodiments of the magnetic resonance device according to the disclosure are configured similarly to the embodiments of the method according to the disclosure. The magnetic resonance device can have further control components which are necessary and/or advantageous for carrying out a method according to the disclosure. The magnetic resonance device can also be configured to transmit control signals and/or to receive and/or process control signals to carry out a method according to the disclosure. As one example, the determining unit is part of the control unit of the magnetic resonance device according to the disclosure. In a memory unit of the determining unit, computer programs, and other software can be stored, by means of which the processor unit of the determining unit automatically controls and/or carries out a sequence of a method according to the disclosure.

A computer program product according to the disclosure can be directly loaded into a memory unit of a programmable determining unit and has program code means to carry out a method according to the disclosure when the computer program product is executed in the determining unit. In this way, the method according to the disclosure can be carried out rapidly, exactly reproducibly and robustly. The computer program product is configured so that, by means of the determining unit, it can carry out the method steps according to the disclosure. The determining unit may have the respective preconditions such as, for example, a corresponding working memory, a corresponding graphics card, or a corresponding logic unit so that the respective method steps can be carried out efficiently. The computer program product is stored, for example, on an electronically readable medium or is saved on a network or server from where it can be loaded into the processor of a local determining unit, which can be directly connected to the magnetic resonance device or configured as part of the magnetic resonance device. Furthermore, control information of the computer program product can be stored on an electronically readable data carrier. The items of control information of the electronically readable data storage medium can be configured such that they carry out a method according to the disclosure when the data carrier is used in a determining unit of a magnetic resonance device. Examples of electronically readable data carriers are a DVD, a magnetic tape or a USB stick, on which electronically readable control information, in particular software, is stored. If this control information (software) is read from the data carrier and stored in a control unit and/or a determining unit of a magnetic resonance device, all the embodiments according to the disclosure of the above-described methods can be carried out.

The disclosure also relates to an electronically readable data carrier on which a program is stored, which is provided for carrying out a method for actuating a magnetic resonance device through output of a saturation pulse.

The advantages of the magnetic resonance device according to the disclosure, the computer program product according to the disclosure, and the electronically readable data carrier according to the disclosure substantially correspond to the advantages of the method according to the disclosure for actuating a magnetic resonance device through output of a saturation pulse, as described in detail above. Features, advantages, or alternative embodiments mentioned herein can also be transferred to the other claimed subject matter, and vice versa.

BRIEF DESCRIPTION OF THE DRAWINGS/FIGURES

Further advantages, characteristics and details of the disclosure will become apparent from the description below of exemplary embodiments and from the drawings.

Figure 2:
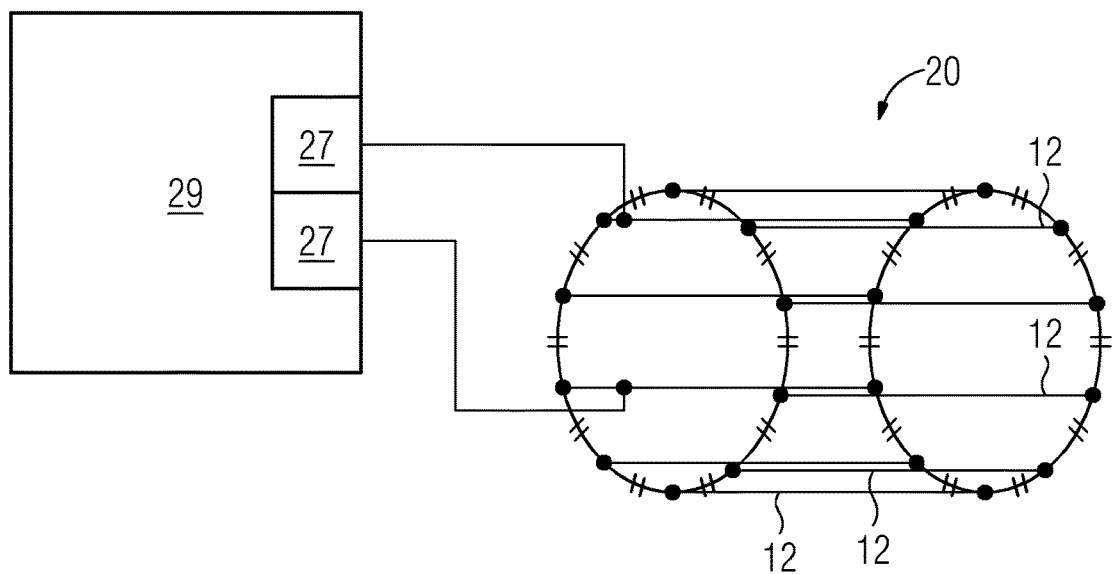

In the drawings:

FIG. 1 shows a schematic representation of a magnetic resonance device according to one or more embodiments of the disclosure, FIG. 2 shows a schematic representation of a high frequency unit according to one or more embodiments of the disclosure, FIG. 3 shows a flow diagram of a first embodiment of a method according to one or more embodiments of the disclosure, and FIG. 4 shows a flow diagram of a second embodiment of a method according to one or more embodiments of the disclosure.

DETAILED DESCRIPTION

FIG. 1 shows a schematic representation of a magnetic resonance device 11 for carrying out a method according to the disclosure. The magnetic resonance device 11 comprises a detector unit consisting of a magnet unit 13 with a main magnet 17 for generating a strong and, in particular, constant main magnetic field 18. In addition, the magnetic resonance device 11 has a cylindrical patient receiving region 14 for receiving a patient 15, the patient receiving region 14 being cylindrically enclosed in a circumferential direction by the magnet unit 13. The patient 15 can be pushed into the patient receiving region 14 by means of a patient positioning apparatus 16 of the magnetic resonance device 11. For this purpose, the patient positioning apparatus 16 has a patient table which is movably arranged within the magnetic resonance device 11.

The magnet unit 13 also has a gradient coil unit 19 which is used for a position encoding during an imaging process. The gradient coil unit 19 is actuated by means of a gradient control unit 28. Furthermore, the magnet unit 13 has a high frequency antenna unit 20 which, in the case shown, is configured as a body coil firmly integrated into the magnetic resonance device 11, and a high frequency antenna control unit 29 for an excitation of a polarization which occurs in the main magnetic field 18 generated by the main magnet 17. The high frequency antenna unit 20 is actuated by the high frequency antenna control unit 29 and radiates high frequency pulses into an examination space which is substantially formed by the patient receiving region 14.

For controlling the main magnet 17, the gradient control unit 28, and the high frequency antenna control unit 29, the magnetic resonance device 11 has a control unit 24. The control unit 24 centrally controls the magnetic resonance device 11, for example, the execution of MR control sequences. In addition, the control unit 24 comprises a reconstruction unit (not disclosed in detail) for reconstructing medical image data which is acquired during the magnetic resonance examination. The magnetic resonance device 11 has a display unit 25. Control information such as, for example, control parameters and reconstructed image data can be displayed on the display unit 25, for example, on at least one monitor for a user. In addition, the magnetic resonance device 11 has an input unit 26 by means of which information and/or control parameters can be input by a user during a scanning procedure. The control unit 24 can comprise the gradient control unit 28 and/or the high frequency antenna control unit 29 and/or the display unit 25 and/or the input unit 26.

The control unit 24 further comprises a determining unit 33. The determining unit 33 is configured for determining a saturation pulse. For this purpose, the determining unit 33 has computer programs and/or software which can be loaded directly into a memory unit (not disclosed in detail) of the determining unit 33, with program means to carry out a method for determining a saturation pulse when the computer programs and/or software are executed in the control unit 33. For this purpose, the determining unit 33 has a processor (not disclosed in detail) which is configured for executing the computer programs and/or software. Alternatively, the computer programs and/or software can also be stored on an electronically readable data carrier 21 configured separately from the control unit 24 and/or the determining unit 33, wherein a data access by the determining unit 33 to the electronically readable data carrier 21 can take place via a data network. The control unit 24 may be configured to actuate the magnetic resonance device 11 according to the determined saturation pulse. For instance, the control unit 24 can be linked to the high frequency unit comprising the high frequency antenna control unit 29 and the high frequency antenna unit 20 and/or via the high frequency unit, to control an output of the saturation pulse.

The magnetic resonance device 11 disclosed can naturally comprise further components that magnetic resonance devices 11 typically have. A general functional principle of a magnetic resonance device 11 is also known to a person skilled in the art, so that a detailed description of the further components is dispensed with. Thus, the magnetic resonance device 11 is configured, together with the control unit 24 and the determining unit 33, for carrying out a method according to the disclosure.

A method for an actuation of a magnetic resonance device 11 comprising an output of a saturation pulse can also exist in the form of a computer program product, which implements the method on the determining unit 33 when it is executed on the control unit 33. An electronically readable data carrier 21 with electronically readable control information items stored thereon can also be provided, said control information items comprising at least a computer program product such as just described and being configured such that, on use of the electronically readable data carrier 21 in a determining unit 33 of a magnetic resonance device 11, they carry out the method described.

FIG. 2 shows a schematic representation of a high frequency unit in an optional embodiment. The high frequency unit comprises the high frequency antenna control unit 29 and the high frequency antenna unit 20. The high frequency antenna control unit 29 comprises, according to this embodiment, a plurality, e.g. at least two, transmitting channels 27. According to this embodiment, the high frequency antenna unit 20 comprises a plurality, e.g. at least two, transmitting elements 12 which, according to this embodiment are fed by the plurality of transmitting channels 27.

The high frequency antenna control unit 29 can also comprise one transmitting channel 27. The high frequency antenna unit 20 can comprise a transmitting element 12 or a plurality of transmitting elements 12 which are fed by one independent transmitting channel 27.

In FIG. 2, for the sake of clarity, only two independent transmitting channels 27 are shown, which are directly connected to two of the transmitting elements 12. The further transmitting elements 12 are also fed by the two independent transmitting channels 27 by way of capacitive and/or inductive coupling. Typically, with this type of actuation of the high frequency antenna unit 20, different elliptical polarizations can be created with corresponding spatial amplitude distribution. With an increasing number of independent transmitting elements 12 fed by different transmitting channels 27, the number of degrees of freedom increases for setting the spatial component of the field distribution more finely.

The transmitting channels 27 are supplied herein, for example, by the high frequency antenna control unit 29 and/or the control unit 24, for example via a signal bus, with data from the saturation pulse to be emitted and the temporal coordination is controlled with the gradients and/or the sequence.

The high frequency antenna unit 20 can be configured as a body coil of a magnetic resonance device 11 according to the disclosure. In place of the body coil, for example, a local coil with an array of antenna coils is also conceivable. In contrast to the body coil, the regions of action of the individual antenna coils are significantly less coupled or with antenna coils further removed from one another, entirely disjointed so that the spatial distribution is provided primarily by the position of the antenna coil and less by interference with the signals of the other antenna coils. In principle, however, it is also conceivable according to the disclosure to use only one transmitting channel 27 and one transmitting element 12 and to optimize only the saturation pulse in the temporal respect according, for example, to an exponentially decaying eddy current. The spatial component could herein partially be compensated by a broader spectral distribution.

FIG. 3 shows a flow diagram of a first embodiment of a method according to the disclosure for an actuation of a magnetic resonance device 11 configured for generating a high frequency pulse for specific saturation of nuclear spins in an examination region of an examination object. The method begins with method step 110, providing a frequency spectrum of the examination region. Method step 150 comprises the establishment of a first resonance frequency for a first tissue and a second resonance frequency for a second tissue taking account of the frequency spectrum. In method step 120, the providing of a B0 field map takes place. The method step 120 can take place at least partially simultaneously with method step 110 and/or method step 150. Method step 170 comprises determining a saturation pulse by establishing a high frequency pulse configured for a spectrally selective excitation of the first tissue and the second tissue taking account of the first resonance frequency, the second resonance frequency and the B0 field map. Method step 180 comprises the output of the saturation pulse via the high frequency antenna unit 20.

The saturation pulse typically has a plurality of components and the high frequency antenna unit 20 e.g. comprises a plurality of transmitting elements 12. In method step 180, the plurality of components is typically output by the plurality of transmitting elements 12.

FIG. 4 shows a flow diagram of a second embodiment of a method according to the disclosure for an actuation of a magnetic resonance device 11 configured for generating a high frequency pulse for specific saturation of nuclear spins in an examination region of an examination object. The second embodiment differs from the first embodiment in that in method step 130, a providing of a first target excitation for the first tissue and a second target excitation for the second tissue takes place. Method step 140 comprises the providing of a B1 field map. The B1 field map and the first target excitation and the second target excitation may be taken into account in method step 170 in that the selective excitation of the first tissue corresponds to the first target excitation and that of the second tissue corresponds to the second target excitation.

Optionally and independently of the method steps 130, 140, the second embodiment of the method according to the disclosure with method step 160 can comprise a selection of a partial region of the examination region, wherein the determination of the saturation pulse in method step 170 is optimized with regard to the selective excitation of the second tissue in the partial region and/or with regard to the selective excitation of the first tissue in the examination region.

Although the disclosure has been illustrated and described in detail based on the preferred exemplary embodiments, the disclosure is not restricted by the examples given and other variations can be derived therefrom by a person skilled in the art without departing from the protective scope of the disclosure.

The term "high-frequency" as used herein may be considered synonymous with radio frequency (RF), and include ranges of RF frequencies as are generally known in the field of MR systems.

The various components described herein may be referred to as "units." Such components may be implemented via any suitable combination of parts, components, hardware, and/or software components as applicable and/or known to achieve the intended functionality of the respective units. This may include mechanical and/or electrical components, FPGAs, processors, processing circuitry, or other suitable hardware components configured to execute instructions or computer programs that are stored on a suitable computer readable medium. Regardless of the particular implementation, such units when applicable and relevant may alternatively be referred to herein as "circuitry," "processors," or "processing circuitry."

What is claimed is:

1. A method for actuation of a magnetic resonance (MR) device comprising a radio frequency (RF) antenna configured to generate an RF pulse for specific saturation of nuclear spins in an examination region of an examination object, the method comprising:

generating, via control circuitry, a frequency spectrum of the examination region;

generating, via the control circuitry, a B0 field map;

determining, via the control circuitry, a first resonance frequency for a first tissue and a second resonance frequency for a second tissue based upon the frequency spectrum;

selecting, via the control circuitry, a partial region of the examination region;

determining, via the control circuitry, a saturation pulse using an RF pulse configured for a spectrally-selective excitation of the first tissue and the second tissue based upon the first resonance frequency, the second resonance frequency, and the B0 field map, the determination of the saturation pulse being based upon (i) the spectrally-selective excitation of the first tissue in the examination region, and (ii) the spectrally-selective excitation of the second tissue in the partial region;

generating, via the control circuitry, the saturation pulse via the RF antenna, the saturation pulse comprising part of an MR control sequence;

executing the MR control sequence to generate MR signals;

acquiring, via the MR device, raw data using the MR signals; and reconstructing, using the acquired raw data, a medical image of the examination region of the examination object.

2. A magnetic resonance (MR) device, comprising:

a radio frequency (RF) antenna configured to generate an RF pulse for specific saturation of nuclear spins in an examination region of an examination object; and control circuitry configured to:
generate a frequency spectrum of the examination region;
generate a B0 field map;
determine a first resonance frequency for a first tissue and a second resonance frequency for a second tissue based upon the frequency spectrum;
select a partial region of the examination region;
determine a saturation pulse using an RF pulse configured for a spectrally-selective excitation of the first tissue and the second tissue based upon the first resonance frequency, the second resonance frequency, and the B0 field map, the determination of the saturation pulse being based upon (i) the spectrally-selective excitation of the first tissue in the examination region, and (ii) the spectrally-selective excitation of the second tissue in the partial region; and
generate the saturation pulse via the RF antenna, the saturation pulse comprising part of an MR control sequence;

executing the control sequence to generate MR signals;
acquiring, via the MR device, raw data using the MR signals; and
reconstructing, using the acquired raw data, a medical image of the examination region of the examination object.

3. A non-transitory computer-readable medium having instructions stored thereon, which are loaded into a memory of a magnetic resonance (MR) device that includes a radio frequency (RF) antenna configured to generate an RF pulse for specific saturation of nuclear spins in an examination region of an examination object, wherein the instructions, when executed by control circuitry, cause the magnetic resonance device to:
generate a frequency spectrum of the examination region;
generate a B0 field map;
determine a first resonance frequency for a first tissue and a second resonance frequency for a second tissue based upon the frequency spectrum;
select a partial region of the examination region;
determine a saturation pulse using an RF pulse configured for a spectrally-selective excitation of the first tissue and the second tissue based upon the first resonance frequency, the second resonance frequency, and the B0 field map, the determination of the saturation pulse being based upon (i) the spectrally-selective excitation of the first tissue in the examination region, and (ii) the spectrally-selective excitation of the second tissue in the partial region; and
generate the saturation pulse via the RF antenna, the saturation pulse comprising part of an MR control sequence;
executing the control sequence to generate MR signals;
acquiring, via the MR device, raw data using the MR signals; and
reconstructing, using the acquired raw data, a medical image of the examination region of the examination object.

4. The method as claimed in claim 1, further comprising:
generating a target excitation for the first tissue and the second tissue; and
generating a B1 field map,
wherein the determining of the saturation pulse is performed based upon the B1 field map such that the selective excitation of the first tissue and of the second tissue corresponds to the target excitation.

5. The method as claimed in claim 1, wherein the selecting of the partial region is landmark-based and/or model-based.

6. The method as claimed in claim 1, wherein the determining of the first resonance frequency and/or of the second resonance frequency is based on a relative relationship with a resonance frequency of water.

7. The method as claimed in claim 1, wherein the first tissue comprises a first fat tissue and the second tissue comprises a second fat tissue.

8. The method as claimed in claim 1, wherein the RF antenna comprises a plurality of transmitting elements, and
wherein the saturation pulse has a plurality of components, which are output when the saturation pulse is output via the plurality of transmitting elements.

9. The MR device as claimed in claim 2, wherein the RF antenna comprises a plurality of transmitting elements, and further comprising:
RF antenna control circuitry comprising a plurality of transmitting channels,
wherein each transmitting element from among the plurality of transmitting elements is coupled to a transmitting channel from among the plurality of transmitting channels.

10. The MR device as claimed in claim 2, wherein the control circuitry is configured to:
generate a target excitation for the first tissue and the second tissue; and
generate a B1 field map,
wherein the determination of the saturation pulse is performed based upon the B1 field map such that the selective excitation of the first tissue and of the second tissue corresponds to the target excitation.

11. The MR device as claimed in claim 2, wherein the control circuitry is configured to select the partial region using a landmark-based and/or a model-based technique.

12. The MR device as claimed in claim 2, wherein the control circuitry is configured to determine the first resonance frequency and/or of the second resonance frequency based on a relative relationship with a resonance frequency of water.

13. The MR device as claimed in claim 2, wherein the first tissue comprises a first fat tissue and the second tissue comprises a second fat tissue.

14. The MR device as claimed in claim 2, wherein the RF antenna comprises a plurality of transmitting elements, and
   wherein the saturation pulse has a plurality of components, which are output when the saturation pulse is output via the plurality of transmitting elements.

15. The method as claimed in claim 1, wherein the first tissue and the second tissue are different from one another.

16. The method of claim 1, wherein the saturation pulse has a frequency band that comprises the first resonance frequency and the second resonance frequency.

17. The method of claim 1, wherein the determining of the saturation pulse comprises determining the saturation pulse to achieve a predefined target excitation for the first resonance frequency and the second resonance frequency without generating a modulation of nuclear spins for a third resonance frequency that is different from the first resonance frequency and the second resonance frequency.

18. The method of claim 17, wherein the third resonance frequency corresponds to the Larmor frequency of water.

\* \* \* \* \*